United States Patent
Bull et al.

[19]

[11] Patent Number: 6,151,341
[45] Date of Patent: Nov. 21, 2000

[54] STACKABLE INTEGRATED DIODE PACKAGING

[75] Inventors: Douglas J. Bull, Franklin, Mass.; Qiang Fu, Nesconset, N.Y.

[73] Assignee: Excel/Quantronix, Inc., East Setauket, N.Y.

[21] Appl. No.: 09/085,637

[22] Filed: May 27, 1998

Related U.S. Application Data

[60] Provisional application No. 60/048,158, May 30, 1997.

[51] Int. Cl.[7] .................................................... H01S 3/04
[52] U.S. Cl. ............................... 372/35; 372/34; 372/36; 372/50; 372/43
[58] Field of Search ................................. 372/34, 35, 36, 372/92, 98, 50

[56] References Cited

U.S. PATENT DOCUMENTS

| | | | |
|---|---|---|---|
| 4,716,568 | 12/1987 | Scifres | 372/72 |
| 5,040,187 | 8/1991 | Karpinski . | |
| 5,099,488 | 3/1992 | Ahrabi | 372/36 |
| 5,105,429 | 4/1992 | Mundinger et al. . | |
| 5,305,344 | 4/1994 | Patel . | |
| 5,311,536 | 5/1994 | Paoli et al. . | |
| 5,504,764 | 4/1996 | Pohlmann | 372/34 |
| 5,764,675 | 6/1998 | Juhala | 372/50 |
| 5,903,583 | 5/1999 | Ullman | 372/35 |

*Primary Examiner*—Robert H. Kim
*Assistant Examiner*—Gioacchino Inzirillo
*Attorney, Agent, or Firm*—Darby & Darby

[57] ABSTRACT

Stackable laser array elements may be configured to absorb heat effectively from laser elements, to be efficiently repaired and/or replaced, and to be effectively tested. An assembly includes readily replaceable cells having a cavity for the passage of coolant therethrough to cool the laser elements. The cells may be constructed individually for individual testing, and then stacked together and removably secured for easy replacement. The cavities of the cells form a substantially contiguous cavity through the entire assembly for the flow of coolant into and out of the assembly. The cavities of the cells include regions and surfaces which enhance the flow of coolant to regions substantially adjacent to the laser elements for the cooling thereof to provide enhanced cooling of the laser elements in the stack of cells. The flow of the coolant is oriented vertically with respect to horizontally oriented laser elements. Various recesses and grooves in the cells permit monitoring devices such as temperature and light sensors to be positioned to collect sensor data to monitor proper operation of the assembly and the laser elements therein.

20 Claims, 5 Drawing Sheets

STACKABLE INTEGRATED DIODE PACKAGING

CROSS-REFERENCE TO RELATED APPLICATIONS

This patent application claims the benefit of U.S. Provisional Patent Application No. 60/048,158, filed May 30, 1997, now abandoned, which is incorporated herein by reference.

BACKGROUND OF THE INVENTION

1. Field of the Invention

This disclosure relates generally to the field of heat dissipating structures for semiconductor devices, and in particular to a diode laser array assembly.

2. Description of Related Art

High power densities of semiconductor laser radiation are typically needed to optically pump lasers, such as Nd:YAG laser rods. Many configurations of two-dimensional stacked diode lasers are known in the prior art; for example, U.S. Pat. No. 4,716,568 to Scifres et al. describes a stacked array assembly of monolithic laser elements which may be dimensioned to be approximately 1 cm in length, about 0.1 mm thick, and having various cavity lengths. In stacking such laser elements, the arrangement generally determines the overall operation. For example, a stack of laser elements may be oriented about a laser rod such as Nd:YAG to operate in a pulse mode. Alternatively, the stack of laser elements may be configured to operate in a continuous current mode.

However, such arrangements of laser elements, in a package, generate a relatively large amount of heat which is to be dissipated. Such heat is generated by the laser elements due to two factors: electrical series resistance and non-radiative recombination. The series resistance of the total package includes the resistance of the semiconductor material of the laser elements and/or the laser array, as well as the resistances of various metal contacts conveying current to each laser element. The amount of heat generated due to series resistance is generally proportional to $I^2R$, in which I is the current flowing through the stacked array, and R is the series resistance of the total package.

In the prior art, heat sinks for such laser elements are known, for example, as described in U.S. Pat. Nos. 5,311,536 to Paoli et al., 5,305,344 to Patel, and 5,040,187 to Karpinski. Microchannel cooling, which is described in U.S. Pat. No. 5,105,429 to Mundigner et al, is another technique in the prior art for extracting the heat generated by the array of laser elements.

Heretofore, such heat dissipative techniques and devices have been somewhat ineffective for high-density packaging of laser elements, such as a plurality of laser diodes closely configured together. A heat dissipative medium or coolant, such as water, is circulated to flow over a set of heat radiating surfaces of a series of laser elements.

In addition, the flow may not allow the coolant to effectively absorb the heat from the most radiative portions of the laser element. For example, in a structure supporting a plurality of laser elements, the path of the flow of water may not be sufficiently close to the most radiative portions of the laser element to absorb the heat therefrom.

A need exists for a stackable laser element, such as a laser bar, and/or a structure mounting such a laser element with improved heat dissipative characteristics.

Typically, the laser elements are configured to be longer in a horizontal direction, and the cooling of such laser elements is performed by passing coolant longitudinally along the horizontal direction along the length of the laser elements. As noted above, the heating of the coolant at one end of the laser element may reduce the efficiency of cooling of the laser elements at another end downstream of the flow. This results in a temperature gradient longitudinally on the laser causing mechanical stressing reducing laser longevity.

Accordingly, a need exists for cooling laser elements which avoids the reduction of efficiency by passing coolant longitudinally in a horizontal direction along the length of the laser elements.

In addition, configurations of stackable laser elements in the prior art have used epoxies and hard soldering to effectively secure the laser elements; for example, to have the laser elements aligned to emit laser radiation in a specific direction. However, in the event that one or more of the laser elements fails or is otherwise defective, the permanence of the laser elements secured together prevents efficient repair and/or replacement of individual laser elements.

Accordingly, a need exists for a stackable laser array element which may be efficiently repaired and/or replaced.

Such laser elements are typically tested prior to assembly in a stack. Accordingly, a need exists for a stackable laser array element which may be effectively tested before stacking.

In addition, laser diode assemblies have typically not employed monitoring devices for ensuring proper operation of the assemblies and the laser elements thereof. Accordingly, the failure of a specific one or a few laser elements has heretofore been difficult to determine for efficient repair and replacement. In addition, such monitoring devices in the prior art may be attached to the outside of the laser diode assembly, which provides relatively inaccurate monitoring since the housing of the assembly prevents positioning of the monitoring devices substantially close to the elements being monitored.

Accordingly, a need exists for a stackable laser array element which permits greater proximity of monitoring devices to the laser elements for improved monitoring and for improved repair and replacement of defective laser elements.

SUMMARY OF THE INVENTION

It is recognized herein that a stackable laser array element may be configured to absorb the heat effectively from laser elements, in particular to effectively absorb the heat from the most radiative portions of the laser element, to be efficiently repaired and/or replaced, and to be effectively tested. Such stackable laser array elements may be configured as a stacked diode laser array for providing laser radiation, for example, to optically pump Nd:YAG lasers and the like.

An assembly of readily replaceable cells including laser elements is disclosed, in which each cell includes a cavity for coolant passage therethrough to cool the laser elements. The cells may be constructed individually for individual testing, and then stacked together and removably secured for easy replacement.

The cavities of the cells form a substantially contiguous cavity through the entire assembly for the flow of coolant into and out of the assembly. The cavities of the cells include regions and surfaces which enhance the flow of coolant to regions substantially adjacent to the laser elements for the cooling thereof to provide enhanced cooling of the laser elements in the stack of cells.

The flow of the coolant is oriented vertically with respect to horizontally oriented laser elements, which avoids the reduction of efficiency by passing coolant longitudinally in a horizontal direction along the length of the laser element.

Various recesses and grooves in the cells permit monitoring devices such as temperature and light sensors to be positioned to collect sensor data to monitor proper operation of the assembly and the laser elements therein.

BRIEF DESCRIPTION OF THE DRAWINGS

The features of the disclosed semiconductor packaging system and method are readily apparent and are to be understood by referring to the following detailed description of the preferred embodiments of the present invention, taken in conjunction with the accompanying drawings, in which.

DESCRIPTION OF THE PREFERRED EMBODIMENTS

Figure 1:
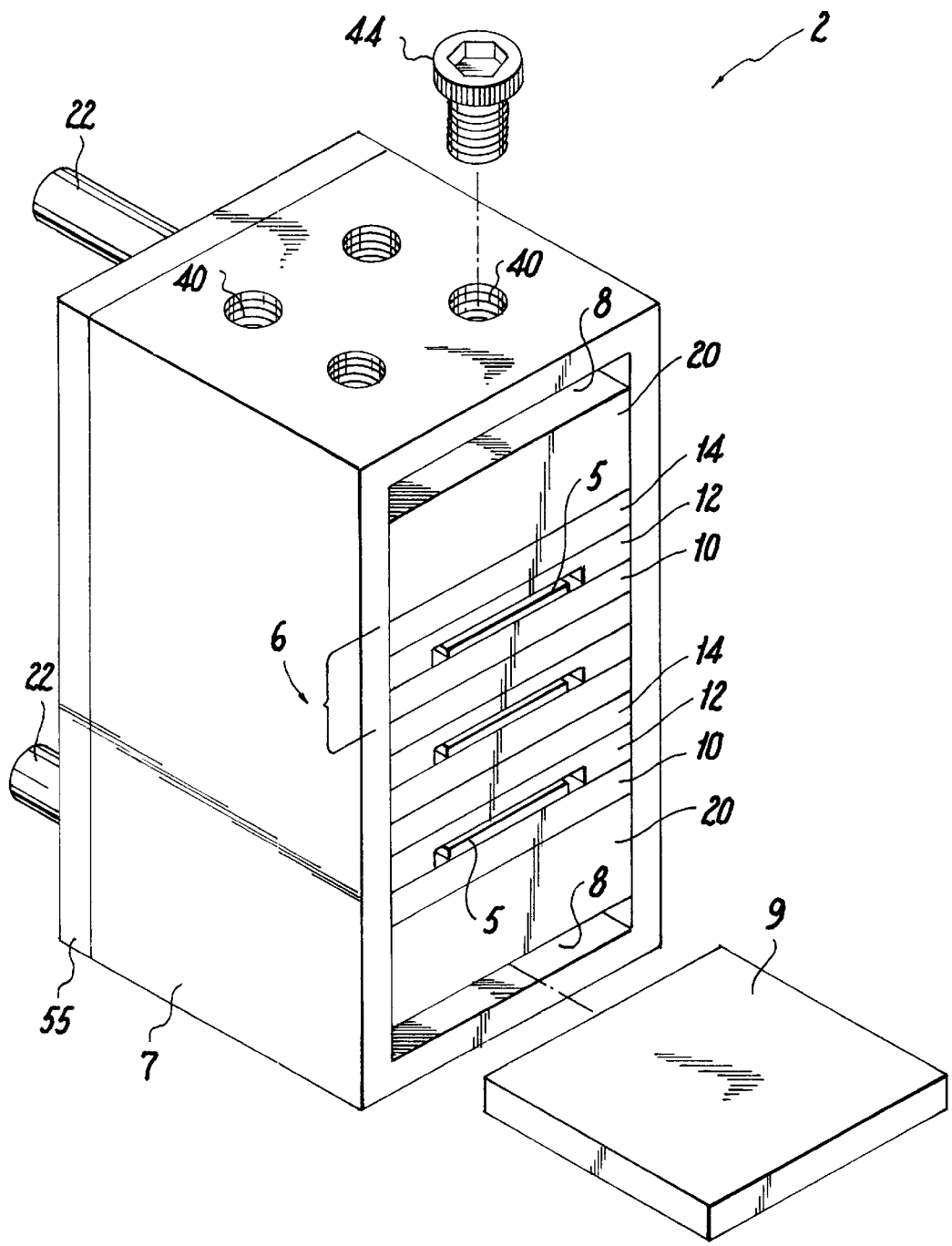
FIG. 1 is a perspective front view of a stackable laser array assembly of the disclosed semiconductor packaging system.

Referring in specific detail to the drawings, with common reference numbers identifying similar or identical elements, steps, and features, as shown in FIG. 1, the present disclosure describes a semiconductor packaging system and method for providing monolithic laser arrays of a plurality of laser elements mounted on stackable supports for efficient repair and/or replacement, and configured for efficient heat dissipation.

As shown in FIG. 1, a laser assembly 2 includes a plurality of laser elements 5, such as laser bars or laser diodes, which may be configured to emit laser radiation from the set of front facets of each laser element. For example, the laser assembly 2 may provide a two-dimensional diode array laser assembly for use in high power laser applications. Each laser element 5 is included in a respective cell 6, with a plurality of such cells 6 mounted in a housing 7. For illustrative purposes, the laser assembly 2 has the plurality of cells 6 in a series arrangement within a vertically oriented housing 7, but it is understood that the housing 7 may be oriented in any direction, such as horizontally or in an angular configuration.

The assembly 2 may have arbitrary dimensions in height, length, and width to house the plurality of cells 5. In a preferred embodiment, the housing 7 is about 3.885 in. (9.868 cm.) in height and about 1.380 in. (3.505 cm.) in length. The internal region of the housing 7 in which the cells 6 are positioned is about 0.880 in. (2.235 cm.) in length by about 0.880 in. (2.235 cm.) in width. Each of the cells 6 is about 0.880 in. (2.235 cm.) in length by about 0.880 in. (2.235 cm.) in width, so that each cell 6 may substantially fit into the internal region of the housing 7. It is understood that other heights, lengths, and widths may be implemented.

Assemblies 2 of larger sizes may accommodate a greater number of cells 5, allowing more laser power to be generated and emitted therefrom.

As shown in FIG. 1, each of the cells 6 is positioned adjacent other cells, except for a top cell and a bottom cell, which are spaced from upper and lower inner surfaces of the housing 7 by coolant inlet/outlet units 20, and upper and lower gaps 8. The upper and lower gaps 8 permit a respective spacer 9 to be inserted therein. The spacer 9 may be used to vertically align the cells 6 within the housing 7. Accordingly, each gap 8 and each spacer 9 may be of arbitrary heights such that the series of cells 8 may be aligned to be a predetermined height from the base of the housing 7, for example, to fix a direction vector of the laser radiation emitted from the cells 6.

Alternatively, the spacers 9 may provide electrical terminal contacts, for example, to act as cathodes and anodes, for connecting an electric source such as a power supply, a voltage source, or a current source to provide electrical energy to the stacked laser elements 5 in the cells 6. In a preferred embodiment, the spacer 9 may be composed of aluminum and may be dimensioned to be about 0.880 in. (2.24 cm.) in length by about 0.880 in. (2.24 cm.) in width, so that each spacer 9 may substantially fit into the internal region of the housing 7. The height or thickness of the spacers 9 may be arbitrary, for example, depending on a predetermined position for the light emitting areas of the laser elements 5 to be situated in relation to the assembly 2.

Each cell 6 includes a base unit 10 for mounting the laser element 5, an isolator unit 12 which may be placed atop a respective base unit 10, and a flow route unit 14 which may be place atop a respective isolator unit 12. As shown in FIG. 1, the base unit 10 of a first cell may be positioned atop the flow route unit 14 of a second cell. The base unit 10, the isolator unit 12, and the flow route unit 14 are described in greater detail herein with reference to FIGS. 3–6. Each of the base unit 10, the isolator unit 12, and the flow route unit 14 may be dimensioned to be about 0.880 in. (2.24 cm.) in length by about 0.880 in. (2.24 cm.) in width, so that each of units 10–14 forming a respective cell 6 may substantially fit into the internal region of the housing 7.

As shown in FIG. 1, the set of cells 6 are positioned within the assembly 5, with upper and lower coolant inlet/outlet units 20 or end caps provided above and below the top and bottom cells, respectively. The upper and lower spacers 9 positioned in the upper and lower gaps 8 are in turn positioned below and above the upper and lower coolant inlet/outlet units 20, respectively, with the coolant inlet/outlet units 20 having an arbitrary height. Accordingly, the respective heights of the upper and lower spacers 9 as well as the respective heights of the coolant inlet/outlet units 20 determine the vertical position of the plurality of cells to fix the direction vector of the laser radiation emitted from the cells 6.

Each of the coolant inlet/outlet units 20 is connected a respective coolant inlet/outlet conduit 22 for conveying a heat dissipative medium or coolant, such as water, into and out of the assembly 2 and through the cells 6, as described herein. For example, the coolant inlet/outlet conduits 22 may be tubular members connected to hoses connected to a pump and a drain for pumping water through the assembly 2 to cool the laser elements 5.

The housing 7 may include or may cooperate with securing means known in the art, such as screws, solder, epoxy, metal and/or rubber gaskets, and the like, for securing the cells 6, spacers 9, and coolant inlet/outlet units 20 in the housing 7. In a preferred embodiment, the securing means removably secures the cells 6, spacers 9, and coolant inlet/outlet units 20 in the housing 7, to permit repair and/or replacement of one or more cells 6. For example, the housing 7 may include a plurality of apertures 40, which may be tapped holes, such that the cells 6, spacers 9, and coolant inlet/outlet units 20 are secured in the housing 7 by hex screws 44, as shown in FIG. 1, in which the apertures 40 and screws 44 form the securing means.

Figure 2:
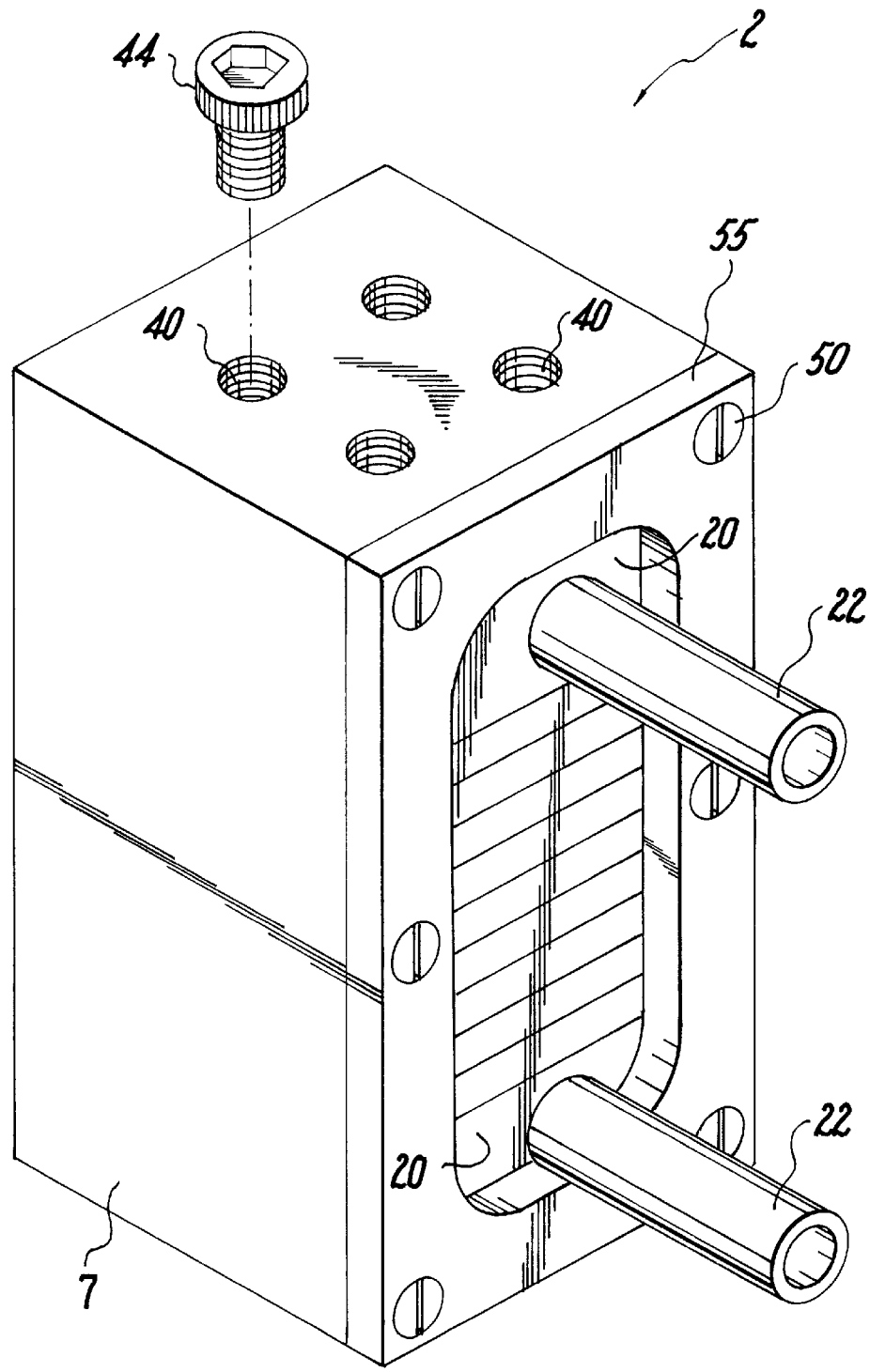
FIG. 2 is a perspective rear view of the stackable laser array assembly of FIG. 1.

The securing means may also include or cooperate with a back alignment plate 55, which may be removably secured to the housing 7 using screws 50 as the securing means, as shown in FIG. 2. The housing 7 and/or the back alignment plate 55 may be composed of a relatively electrically non-conductive material, such as "LEXAN", and may be relatively inflexible. Accordingly, the hex screws 44, the back alignment plate 55, and the screws 50 may tightly squeeze the cells 6 together to form a substantially sealed configuration to the entire assembly 2. For example, the assembly 2 may be substantially hermetically sealed to provided a sealed path for the flow of the coolant such as water through the assembly 2 and the cells 6 thereof.

In addition, the back alignment plate 55 allows the cells 6 to be substantially aligned with each other to provide, for example, a uniform emission of laser radiation from the laser elements 5. Such alignment may be critical to the operation of solid state laser pumping applications.

Figure 3:
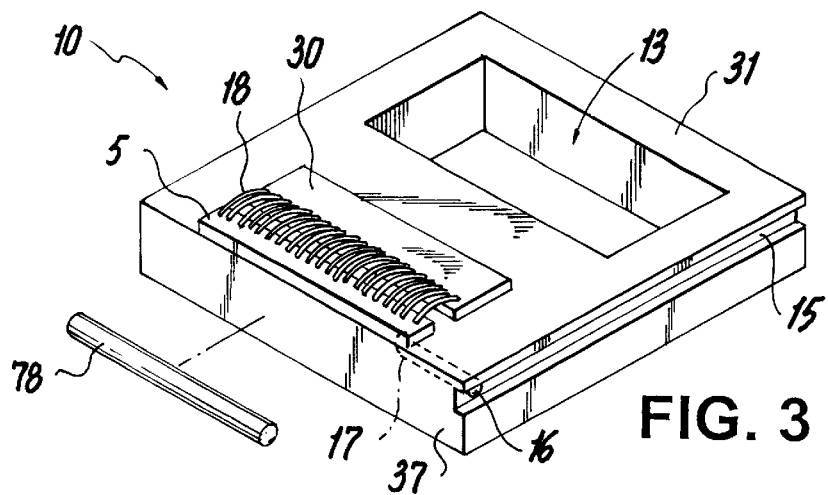
FIG. 3 is a perspective top view of a base unit of a cell.

As shown in FIG. 3, the base unit 10 of a cell 6 includes a base portion 31 having a ceramic substrate 30 and the laser element 5 mounted thereon. The laser element 5 is positioned substantially adjacent to the front portion 37 of the base portion 31, for emitting the laser radiation therefrom.

At least one wire 18 electrically connects the laser element 5 to the ceramic substrate 30 for activation thereof. Typically, 40–60 wires may be used. In a preferred embodiment, the laser element 5 is a monolithic laser bar which is dimensioned to be about 1 cm. in length, about 0.6 mm in width between cleaved mirror facets, and about 0.1 mm in height between negative and positive sides of the laser bar. The laser element 5 may be a semiconductor-based laser, or other lasers and masers known in the art.

The laser element 5 is configured such that the activation by electrical energy conveyed from the ceramic substrate 30 through the at least one wire 18 causes the emission of laser radiation outward from the front facet of the laser element 5 and away from the base unit 10.

In the preferred embodiment, the ceramic substrate 30 may be composed of $Al_2O_3$, AlN, BeO, or ceramic compounds known in the art, and is metallized on the top and bottom portions, with a predetermined gap in the metallization to provide an isolating non-metallized gap on the sides and/or other non-conductive substances may be used to provide electric isolation between the top and bottom portions. The laser element 5 and the ceramic substrate 30 may be mounted on the base portion 31 by soldering using, for example, thermally evaporated indium.

Figure 8:
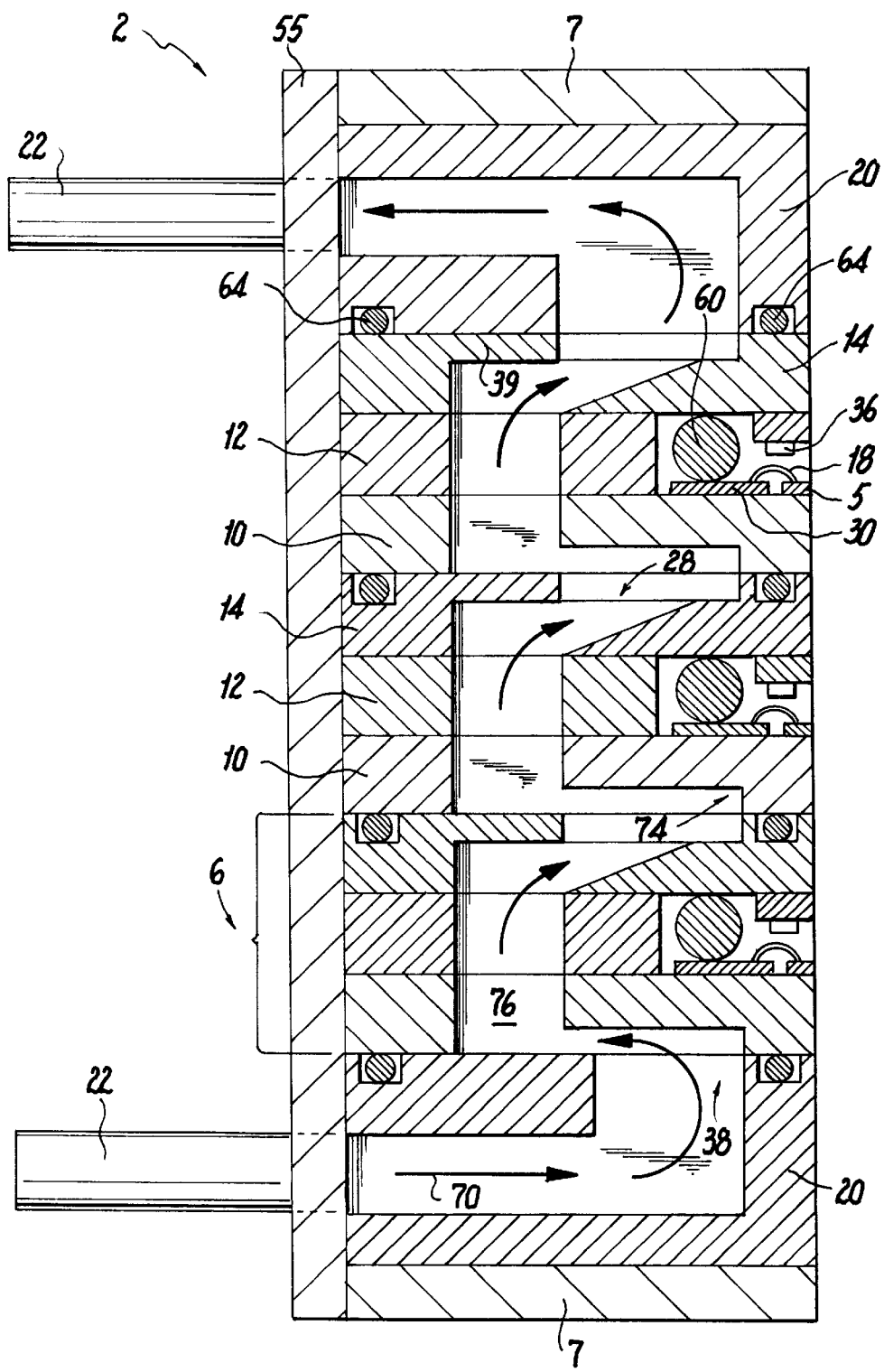
FIG. 8 is a side cross-sectional view of the stackable laser array assembly of FIGS. 1–2.

As shown in FIG. 3 in conjunction with FIG. 8, the base unit 10 has a cavity 13 formed through the base portion 31 for providing passage for the coolant 70. The front portion 37 includes a recess 38, as shown in FIG. 8, which provides an edge or corner 72 substantially close to the underside of the laser element 5, and which provides a flow passage to the cavity 13 to remove heat generated by the laser element 5 as well as by any other components such as the wire 18.

In alternative embodiments, the base portion 31 of the base unit 10 includes a slot 15 on at least one of the sides thereof and an orifice 16 which extends, internally and/or externally, to a detection position 17 substantially adjacent to the laser element 5. A heat sensor (not shown in FIG. 3), such as a thermistor, may be positioned within the orifice 16 with a detecting end of the heat sensor disposed at the detection position 17.

The slot 15 provides a passage for at least one electric wire to connect the heat sensor to, for example, an external data bus (not shown in FIG. 3) for collecting heat data signals to monitor the heat generated by the laser element 5. Preferably, the external data bus is positioned relatively remote from the laser element 5, for example, to prevent the heat of the laser element 5 from affecting the data collection, for example, by changing the resistance of the external data bus. In an alternative embodiment, the slot 15 may be eliminated and the external data bus may be positioned substantially adjacent to the laser element 5 with the heat sensor connected thereto.

Figure 4:
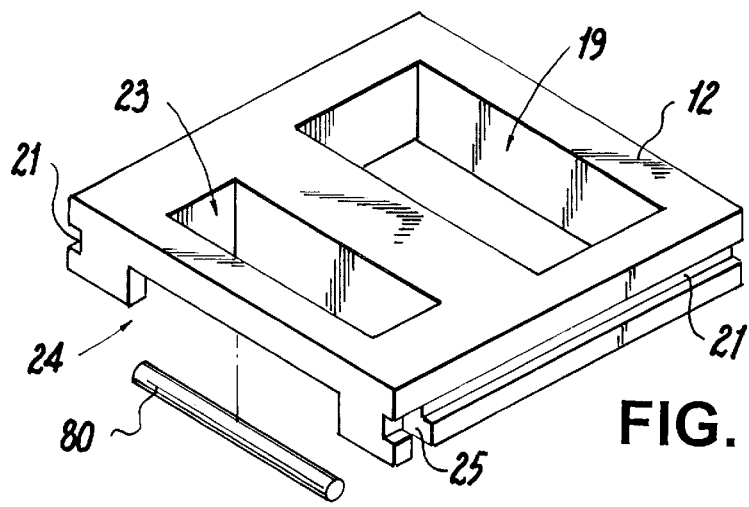
FIG. 4 is a perspective top view of an insulator unit of a cell.
Figure 5:
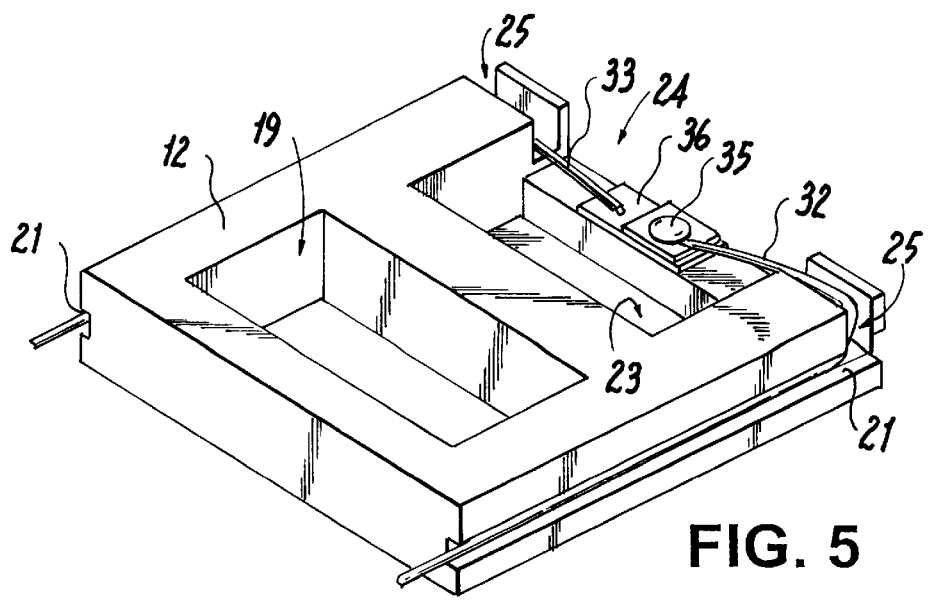
FIG. 5 is a perspective underside view of the insulator unit of FIG. 4.

As shown in FIG. 4 in conjunction with FIGS. 5 and 8, the isolator unit 12 has a cavity 19 which substantially aligns with the cavity 13 of the base unit 10 upon which the isolator unit 12 is positioned, such that the coolant 70 may flow through the cavities 13 and 19. The isolator unit 12 also includes a cavity 23 for providing passage for electrical connections, such as a wire 60 as described herein, and includes a recess 24 into which the laser element 5 and the wire 18 of the below-positioned base unit 10 are positioned.

A collimating lens may be disposed and/or positioned in front of the laser element 5 for effectively focussing the laser radiation therefrom. Such a collimating lens may be attached or mounted to the base unit 10 and/or to the isolator unit 12. For example, as shown FIG. 3, a collimating lens 78 may be a cylindrical structure mounted upon the base unit 10 to receive and collimate the laser radiation from the laser element 5.

Alternatively, as shown in FIG. 4, the recess 24 of the isolator unit 12 may also permit a cylindrical collimating lens 80 to be positioned in front of the laser element 5, with the collimating lens attached or mounted to the isolator unit 12 such as upon an underside of the recess 24. In other alternative embodiments, the collimating lens may be mounted by a frame or structure to be attached to the base unit 10 and/or the isolator unit 12 with the collimating lens positioned generally as shown in FIGS. 3–4.

It is to be understood that, in addition to or alternative to a cylindrical collimating lens, other shapes and structures as well as any known compositions may be used for the collimating lens, such as an assembly of collimating elements arranged, for example, in an array.

The isolator unit 12 may be composed of "TEFLON" (polytetrafluoroethylene), "DELRIN", "LEXAN" or other relatively good insulating materials to provide electrical isolation between the base unit 10 and the flow route unit 14 of a given cell 6.

The isolator unit 12 may also include at least one groove 21 extending along the length of at least one side of the isolator unit 12 for providing passage of a wire from an external data bus (not shown in FIG. 4). At least one notch 25 is also provided which extends from a respective groove 21 to the recess 24 for providing passage of the wire along the respective groove 21 to a detector 35 positioned in the recess 24, as shown in FIG. 5. The notch 25 may be oriented to be perpendicular to the groove 21, or alternatively may be configured to be oriented at an angle to the groove 21.

As shown in FIG. 5 in conjunction with FIGS. 4 and 8, in an underside perspective, the isolator unit 14 includes the detector 35 positioned within the recess 24 by a ceramic substrate 36, which may be metallized. The detector 35 and/or the ceramic substrate 36 may be mounted to the underside of the recess 24 by securing means, such as epoxy.

The detector 35 may be a commercially available optical sensor, or other electromagnetic sensors, for detecting the output of the laser element 5; for example, to ensure the proper operation of the laser element 5. The wires 32–33 are connected to the detector 35 and run through the notches 25 and the grooves 21 to be connected to the external data bus (not shown in FIG. 5), for transmitting detection signals from the detector 35 to the external data bus.

Figure 6:
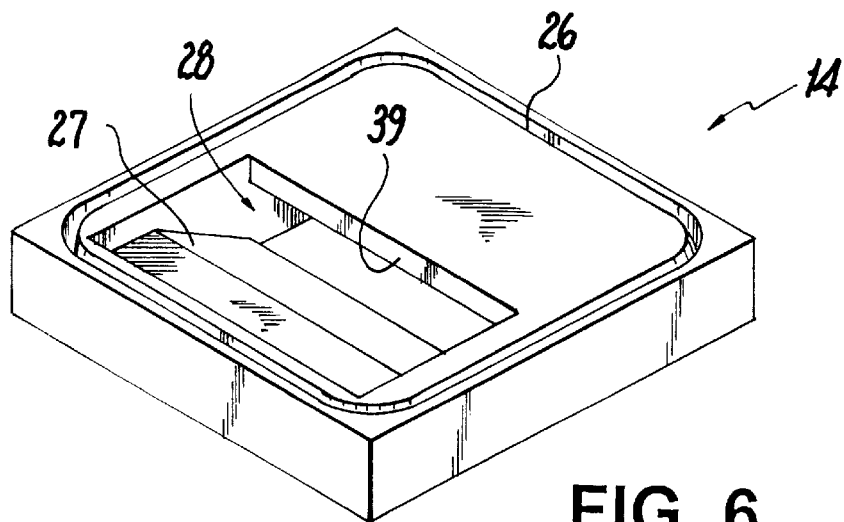
FIG. 6 is a perspective top view of a flow route unit of a cell.

As shown in FIG. 6 in conjunction with FIG. 8, the flow route unit 14 includes a groove 26 for positioning sealing means therein, for example, the O-ring 64 as sealing means as shown in FIG. 8, to substantially seal the joint between the flow route unit 14 of a first cell and the base unit 10 of a second cell, to prevent any flow of the coolant 70 out of the assembly 2 through the joints between cells 6. The flow route unit 14 of a first cell is positioned atop the isolator unit 12 of the first cell to be between the isolator unit 12 of the first cell and the base unit 10 of the second cell.

The flow route unit 14 may be composed of relatively high conductivity copper and/or other materials with relatively high thermal conductivity and relatively good electrical conductivity. The flow route unit 14 includes a ramp portion 27 and an overhang portion 39 forming an elongated cavity 28. As shown in FIG. 8, the elongated cavity 28 of a flow route unit 14 has a lower region which substantially aligns with the cavity 19 of the isolator unit 12 positioned thereunder, and has an upper region which substantially aligns with the recess 38 of the front portion 37 of the base unit 10 of cell 6 positioned thereabove. The overhang portion 39 is configured to operate in conjunction with the ramp portion 37 to orient the direction of the flow of the coolant 70 from the flow route unit 14 to the base unit 10 of another cell positioned thereabove.

The flow route unit 14 is thus configured to route the coolant 70 substantially close to a laser element 5 to extract the heat generated therefrom. In addition, the conductivity of the flow route unit 14 provides an electrical path to convey electrical current to a next stacked cell positioned thereabove.

Accordingly, as shown in FIG. 8, the coolant 70 may flow into a first cell through the recess 38 and the cavity 13 of a base unit 10 to the cavity 19 of the isolator unit 12 to the elongated cavity 28 of the flow route unit 14 and thence to the recess 38 of a next cell.

Figure 7:
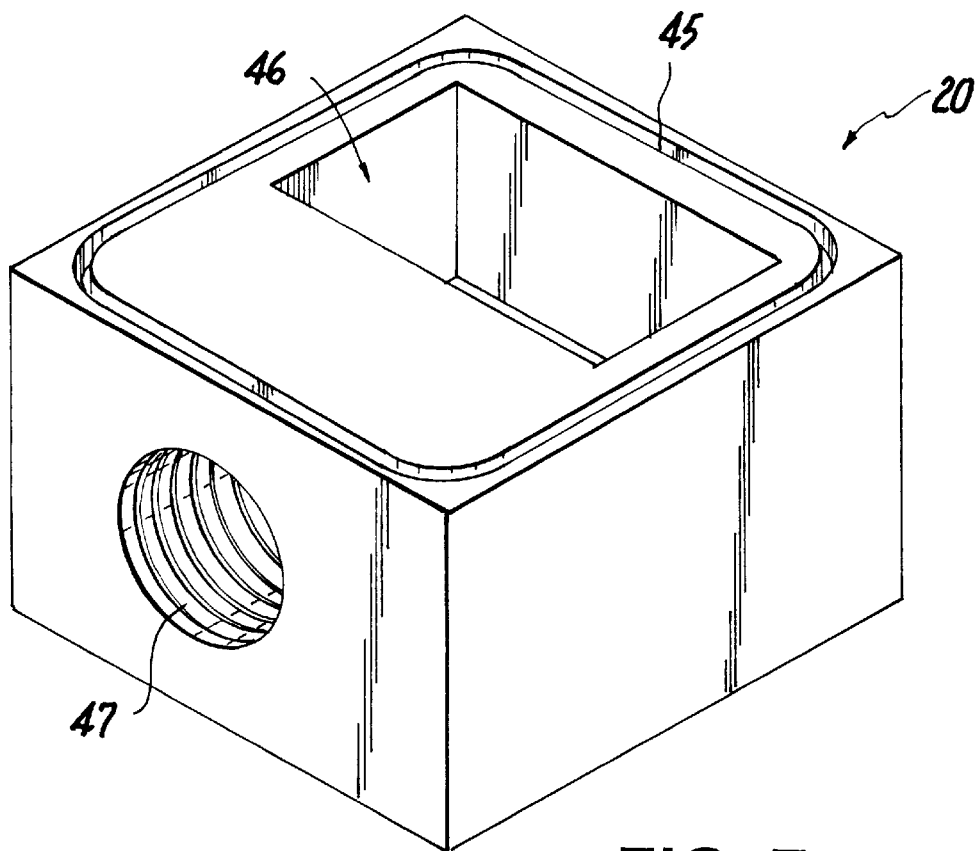
FIG. 7 is a perspective view of a coolant inlet/outlet unit.

As shown in FIG. 7, the coolant inlet/outlet unit 20 includes a groove 45 or channel for positioning sealing means therein, for example, the O-ring 64 as sealing means as shown in FIG. 8, to substantially seal the joint between a coolant inlet/outlet unit 20 and a cell 6 in the plurality of stacked cells, to prevent any flow of the coolant 70 out of the assembly 2 through the joints between the cells 6 and the coolant inlet/outlet units 20. Each coolant inlet/outlet unit 20 also includes a cavity 46 which extends inward and which is connected to an inlet/outlet orifice 47 for connection to a respective conduit 22. In a preferred embodiment, the inlet/outlet orifice 47 is threaded to engage a threaded end of the conduit 22 in a sealed configuration. Alternatively, each inlet/outlet orifice 47 and respective conduit 22 may include sealing means, such as an O-ring or a washer, to provide a sealed configuration to prevent the coolant 70 from flowing from any space between the orifice 47 and the conduit 22.

In one embodiment, as shown in FIGS. 1–2 and 8, the coolant inlet/outlet units 20 and the cells 6 are arranged such that a first unit 20 performs as an inlet interface and a second unit 20 performs as an outlet interface with the conduits 22 connected thereto. In such an arrangement, the plurality of cells 6 are stacked between the two units 20, with each cavity 46 of each inlet/outlet unit 20 being substantially aligned with a respective one of the cavities 13 and 28 of the components of the cells corresponding to the ends (or top and bottom) of the stack of cells 6.

In the preferred embodiment shown in FIGS. 7–8, the inlet/outlet units 20 are configured substantially in an L-shape, with a single cavity 46 and a single orifice 47 oriented at an angle of about 90°. In alternative embodiments, the inlet/outlet units 20 may be configured to be substantially T-shaped or to have other pipe-like shapes, and may be configured to have a plurality of cavities 46 and a plurality of orifices 47 to provide a plurality of paths for the flow of the coolant 70 from a plurality of stacks of cells 6 to a plurality of conduits 22.

As shown in FIG. 8, the operation of the disclosed semiconductor packing system is illustrated in greater detail, in which a plurality of cells 6 are stacked, with the inlet/outlet units 20 acting as end caps positioned at the top of and at the bottom of the stack of cells 6. A set of wires 60 are positioned within the recess 24 of each isolator unit 12, such that each metallized ceramic substrate 30 may be electrically connected to a respective electrically conductive flow route unit 14. A source of electric energy, such as a power supply, a voltage source, etc., may then be connected to the wires 60 for supplying energy to each ceramic substrate 30 and thence to each laser element 5 of each cell 6 for activation thereof.

In a preferred embodiment, the wires 60 are composed of a malleable metal such as indium, which allows the wires 60 to deform during construction of a cell 6 by placement of the units 10–14. Such deformation ensures that a sufficient electrical contact is maintained between the ceramic substrate 30 and the flow route unit 14. Alternatively, other metals may be used such as, but not limited to, tin. In other embodiments, electrical contact means may be used which provides substantial electrical contact between the ceramic substrate 30 and the flow route unit 14. For example, a spring or a sheet of stainless steel as electrical contact means configured to provide substantial electrical contact may be used.

At least a first conduit 22 receives in-flowing coolant 70 which flows into the corners 72, 74 provided in the recesses 38 of the cells 6 substantially near the laser elements 5 to substantially uniformly cool the laser elements 5. The coolant 70 then flows away from the recesses 38 toward a substantially contiguous cavity 76 formed by the cavities of the units 10–14. The overhang portions 39 ensure that the coolant 70 substantially flows toward the corners 72, 74 to substantially uniformly cool the laser elements 5. The circuitous flow of the coolant 70 continues through the stack of the plurality of cells 6 to flow out of at least a second conduit 22.

As shown in FIG. 8, the inward flow of the coolant 70 and the substantially contiguous cavity 76 of the assembly 2 are configured to convey the coolant 70 upward through the cavities of the stack of cells 6. In an alternative environment, the coolant 70 may flow downward through the cavities. One having ordinary skill in the art would understand that the assembly 2 may be oriented to be positioned in an angular direction, so the description of the flow of the coolant 70 herein is not limited to upward or downward directions.

As shown in FIG. 8, the flow of the coolant 70 is oriented vertically with respect to horizontally oriented laser elements 5 to substantially uniformly cool the laser elements 5, which avoids the reduction of efficiency by passing the coolant 70 longitudinally in a horizontal direction along a horizontal length of the laser elements 5. Such efficiency in heat dissipation is attained by having the flow of the coolant 70 oriented at about 90° with respect to the longitudinal length of the laser elements 5. In an alternative embodiment, the flow of the coolant 70 may be oriented at an angle θ to the longitudinal length of the laser elements 5, in which $0°<θ≦90°$.

A plurality of sealing means such as O-rings 64 are provided to substantially seal the joints between the stacked components of the assembly 2. In addition, in a preferred embodiment, at least the internal regions of the units 10–14, the coolant inlet/outlet units 20, and the conduits 22 may be gold plated to avoid oxidation thereof from the coolant 70. Alternatively, a non-oxidizing coolant 70 may be used.

In the preferred embodiment, as shown in FIGS. 8, the internal surfaces of the units 10–14 and the coolant inlet/outlet units 20 may be planar and have angular and/or perpendicular orientations; that is, sharp corners may be formed. Such sharp corners and planar surfaces may enhance the flow of the coolant 70 to the regions substantially adjacent to the laser elements 5; for example, turbulence and eddies within the units 10–14 and 20 may ensure that the coolant 70 engages the internal surfaces and regions substantially adjacent to the laser elements 5. In an alternative embodiment, the internal surfaces and regions of the units 10–14 and 20 may be curved to enhance the flow of the coolant 70 throughout the cavities of the assembly 2 for efficient heat dissipation from the laser elements 5.

In the preferred embodiment, the coolant 70 provides for heat dissipation from the laser elements 5. In an alternative embodiment, the coolant 70 may also itself be cooled. For example, the assembly 2 may have cooling means, such as a tube for passage of cooled freon, substantially adjacent to the back alignment plate 55 to cool the coolant 70 as the coolant 70 flows toward the back portion of the assembly 2, such as within the substantially contiguous cavity 76. The back alignment plate 55 may be metallic or otherwise thermally conductive. Alternatively, cooling means may be disposed within the back alignment plate 55, in a manner known in the art.

Since each cell 6 may be stacked and secured, for example, using the screws 44 and 50, the mounting of the cells 6 in a stacked arrangement does not require solder, epoxy, etc. Accordingly, the assembly 2 and the cells 6 thereof are readily repairable, with defective cells readily replaceable by disassembly of the assembly 2 and removal and replacement of the defective cells.

In addition, each cell 6 may be prefabricated using a fabrication process separate from final assembly into the stack. Accordingly, stringent testing of individual laser elements prior to assembly or stacking may be performed.

In addition, the use of appropriate recesses and grooves in the units 10–14 permits monitoring devices such as temperature and light sensors to be positioned to collect sensor data to monitor proper operation of the assembly 2 and the laser elements 5 therein. The recesses and grooves permit greater proximity of monitoring devices to the laser elements 5 for more accurate data collection.

While the disclosed semiconductor packaging system and method is particularly shown and described herein with reference to the preferred embodiments, it is to be understood that various modifications in form and detail may be made without departing from the scope and spirit of the present invention. For example, in addition to laser elements, other semiconductor devices such as integrated circuits may be packaged as described herein, with heat dissipation performed as described herein. Accordingly, modifications such as any examples suggested herein, but not limited thereto, are to be considered within the scope of the present invention.

What is claimed is:

1. A laser array comprising:
    a plurality of cells positioned substantially adjacent to each other in an array configuration, each of the plurality of cells including:
        a laser element; and
        a cell cavity for passing coolant therethrough to substantially uniformly cool the respective laser element;
    wherein, for each of the plurality of cells, the respective cell cavity thereof is positioned substantially adjacent to another cell cavity of another cell of the plurality of cells, thereby forming a substantially contiguous array cavity extending through the plurality of cells for passing coolant therethrough.

2. The laser array of claim 1, further comprising:
    sealing means positioned between adjacent cells for forming a seal therebetween to prevent flow of the coolant from the joint between adjacent cells.

3. The laser array of claim 1, wherein the plurality of cells are stacked in a linear array configuration.

4. The laser array of claim 1, further comprising:
    a housing in which the plurality of cells are mounted.

5. The laser array of claim 1, further comprising:
    at least one monitoring device for monitoring operation of the laser elements.

6. The laser array of claim 3, wherein each of the plurality of cells is removably stacked in the linear array configuration, thereby facilitating removal therefrom.

7. The laser array of claim 3, wherein the plurality of cells are stacked along a first direction in the linear array configuration; and
    wherein each of the laser elements is oriented to have a longitudinal axis oriented at an angle θ to the first direction, with $0°<θ≦90°$.

8. The laser array of claim 7, wherein the coolant flows substantially along the first direction, thereby causing the coolant to substantially uniformly cool the laser elements to improve heat dissipation from the laser elements having the angular orientation to the first direction.

9. The laser array of claim 5, wherein each of the plurality of cells includes an aperture in which the at least one monitoring device is mounted substantially adjacent to a respective laser element of the respective cell.

10. The laser array of claim 4, further comprising:
    securing means for securing the plurality of cells in the housing.

11. The laser array of claim 10, wherein the securing means removably secures the plurality of cells in the housing, thereby facilitating removal therefrom.

12. A laser array comprising:
    a plurality of cells positioned substantially adjacent to each other in an array configuration, each of the plurality of cells including:
        a base unit having a laser element;
        an isolator unit positioned adjacent to the base unit; and
        a flow route unit positioned adjacent to the base unit;
        wherein each of the base unit, the isolator unit, and the flow route unit includes a unit cavity for passing coolant therethrough, the unit cavity of the base unit being substantially adjacent to the respective laser element for passing coolant adjacent to the laser element to substantially uniformly cool the laser element, and each of the unit cavities of the respective units of a respective cell forms a substantially contiguous cell cavity through the respective cell for passing coolant through the cavity; and wherein, for each of the plurality of cells, the respective cell cavity thereof is positioned substantially adjacent to another cell cavity of another cell of the plurality of cells, thereby forming a substantially contiguous array cavity extending through the plurality of cells for passing coolant therethrough.

13. The laser array of claim 12, wherein each base unit includes an aperture in which at least one monitoring device is mounted substantially adjacent to a respective laser element.

14. The laser array of claim 12, wherein, for each cell, a collimating lens is disposed substantially adjacent to the respective laser element for focussing the laser energy emitted from the laser element.

15. The laser array of claim 12, wherein, for each cell, each flow route unit is electrically conductive; and wherein each base unit of a respective cell includes:
 a substrate electrically connected to the respective laser element; and
 conducting means for electrically connecting the substrate to a respective flow route unit of the respective cell for transmitting energy through the substrate to the laser element to operate the laser element.

16. The laser array of claim 12 further comprising:

a housing in which the plurality of cells are disposed; and at least one spacer unit for adjustably positioning the plurality of cells in the housing.

17. The laser array of claim 15, wherein the base unit includes:
 at least one wire for electrically connecting the substrate to the respective laser element.

18. The laser array of claim 15, wherein, for each cell, the respective isolator unit includes a recess in which the conducting means of the respective base unit of the respective cell is disposed.

19. A method for cooling a plurality of laser elements in a laser array, the method comprising the steps of:
 positioning a plurality of cells substantially adjacent to each other in an array configuration, wherein each of the plurality of cells includes:
  a respective laser element; and
  a cell cavity;
 positioning each cell cavity substantially adjacent to another cell cavity of another cell of the plurality of cells, thereby forming a substantially contiguous array cavity extending through the plurality of cells; and
 passing coolant through the substantially contiguous array cavity to substantially uniformly cool each laser element of each cell.

20. The method of claim 19, wherein the step of positioning the plurality of cells includes the steps of:
 stacking the plurality of cells along a first direction in a linear array configuration; and
 orienting each of the laser elements to have a longitudinal axis oriented at an angle $\theta$ to the first direction, with $0° < \theta \leq 90°$; and
 wherein the step of passing coolant includes the step of passing the coolant substantially along the first direction, thereby causing the coolant to substantially uniformly cool the laser elements to improve heat dissipation from the laser elements.

* * * * *

UNITED STATES PATENT AND TRADEMARK OFFICE
CERTIFICATE OF CORRECTION

PATENT NO. : 6,151,341
DATED : November 21, 2000
INVENTOR(S) : Douglas J. BULL and Qiang FU It is certified that errors appear in the above-identified patent and that said Letters Patent is hereby corrected as shown below:

Title page, [75], Inventors, change "Nesconset, N. Y." to -- Port Jefferson, N.Y.- -.

Signed and Sealed this

Twenty-second Day of May, 2001

Attest:

NICHOLAS P. GODICI

Attesting Officer     *Acting Director of the United States Patent and Trademark Office*